United States Patent
Schuppe

(10) Patent No.: US 7,333,926 B2
(45) Date of Patent: Feb. 19, 2008

(54) METHOD, APPARATUS, AND COMPUTER PROGRAM PRODUCT FOR FACILITATING MODELING OF A COMBINATORIAL LOGIC GLITCH AT AN ASYNCHRONOUS CLOCK DOMAIN CROSSING

(75) Inventor: Raymond W. M. Schuppe, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 11/149,484

(22) Filed: Jun. 9, 2005

(65) Prior Publication Data

US 2006/0282251 A1  Dec. 14, 2006

(51) Int. Cl.
G06F 17/50 (2006.01)

(52) U.S. Cl. .................. 703/15; 716/3; 716/5
(58) Field of Classification Search .............. 703/2, 703/15–19; 716/3, 4–6; 713/500
See application file for complete search history.

(56) References Cited

U.S. PATENT DOCUMENTS 6,785,873 B1 * 8/2004 Tseng ............... 716/4
7,089,518 B2 * 8/2006 Bair et al. ............ 716/6
2005/0268265 A1 * 12/2005 Ly et al. ............. 716/6

OTHER PUBLICATIONS

"Simulation Testing of Digital Logic Circuit Designs," U.S. Appl. No. 10/904,056, filed Oct. 21, 2004 by Blanco et al.

* cited by examiner

Primary Examiner—Thai Phan
(74) Attorney, Agent, or Firm—Heslin Rothenberg Farley & Mesiti, PC

(57) ABSTRACT

A method, apparatus and computer program product are provided for facilitating combinatorial logic modeling at an asynchronous clock domain crossing. The modeling technique employs a simulation value of X in combinatorial logic at the asynchronous clock domain crossing of a circuit being modeled to facilitate modeling of a potential combinatorial logic glitch at the crossing during metastability periods thereof. Employing the simulation value of X includes: generating one or more equivalent functional equations for one or more combinatorial paths through the combinatorial logic at the crossing; propagating the simulation value of X through the combinatorial logic using the at least one equivalent functional equation; and then converting the simulation value of X at an output of the combinatorial logic of the asynchronous clock domain crossing to a random logic value for further propagation within the circuit being modeled.

20 Claims, 8 Drawing Sheets

METHOD, APPARATUS, AND COMPUTER PROGRAM PRODUCT FOR FACILITATING MODELING OF A COMBINATORIAL LOGIC GLITCH AT AN ASYNCHRONOUS CLOCK DOMAIN CROSSING

TECHNICAL FIELD OF THE INVENTION

This invention relates generally to modeling circuits, and more particularly, to a technique for modeling glitch-prone combinatorial logic at an asynchronous clock domain crossing of an ASIC design.

BACKGROUND OF THE INVENTION

Integrated circuits often have multiple clock domains. In each clock domain, a domain clock is driven by a clock operating at a particular frequency that is different from the clock frequency of the clocks in other clock domains. An asynchronous clock domain crossing refers to an interface between two of these differently clocked logic domains. Often, logic such as combinatorial logic exists at an asynchronous clock domain crossing in ASIC designs. Logic at asynchronous clock domain crossings is conventionally difficult to verify. This is because the receiving sequential element at the crossing may or may not capture a correct or consistent data value when a transmitting sequential element at the crossing (from the asynchronous clock domain) launches a new value. The incorrect value may be received due to a violation of a set up or hold time at the receiving sequential element (which is known as metastability) or even in the absence of metastability. Without metastability, a clock domain crossing problem may exist if a signal change randomly arrives either before or after the metastable period, or may occur due to races between parallel paths of the logic, which are known as clock domain crossing glitches.

Various simulation tools exist in the art to help reveal these types of problems. These simulation tools identify where logic signals cross over between domains and typically insert a simulation model in the signal path that generates a random logic value (0 or 1) during periods of potential inconsistency. This random logic generation is often called jitter when discussing clock domain crossings. Many designers at electronic design automation companies also do this manually by inserting specially designed Wire Asynchronous Models (WAMs) into their logic. The advantage of simulation tools is that they do this automatically.

FIG. 1A depicts one embodiment of an asynchronous clock domain crossing, generally denoted 100, wherein a transmitting sequential element 110 (e.g., latch) of a first clock domain launches logic values through combinatorial logic 120 to a receiving sequential element 130 in a second clock domain. During modeling, a WAM 140 is often inserted immediately after the transmitting sequential element 110 (as shown in FIG. 1B) to facilitate modeling of metastability. Traditional simulation tools (employing WAMs) do a good job at identifying clock domain crossing metastability problems in cases where a signal changes intermittently either before or after the period of metastability. However, existing simulation approaches often do not correctly identify problems caused by clock domain crossing glitches.

SUMMARY OF THE INVENTION

The shortcomings of the prior art are overcome and additional advantages are provided through the provision of a method for modeling combinatorial logic at an asynchronous clock domain crossing. The method includes employing a simulation value of X in combinatorial logic at an asynchronous clock domain crossing of a circuit being modeled for facilitating modeling of a combinatorial logic glitch. The employing includes: propagating the simulation value of X through the combinatorial logic at the asynchronous clock domain crossing; and converting the simulation value of X at an output of the combinatorial logic to a random logic value for further propagation within the circuit being modeled.

In enhanced aspects, the method includes analyzing at least one combinatorial logic path of the combinatorial logic at the asynchronous clock domain crossing, and generating at least one equivalent functional equation for the at least one combinatorial logic path. Propagating of the simulation value of X through the combinatorial logic includes employing the at least one equivalent functional equation. In one embodiment, at least one equivalent functional equation is generated for each Register Transfer Language based combinatorial block in the at least one combinatorial logic path. The generating of the at least one equivalent functional equation for the at least one combinatorial logic path is performed only for the combinatorial logic at the asynchronous clock domain crossing of the circuit being modeled.

Further, the asynchronous clock domain crossing may comprise a transmitting sequential element and a receiving sequential element, with the combinatorial logic being disposed between the transmitting sequential element and the receiving sequential element. In this implementation, the method further includes inserting the simulation value of X into the combinatorial logic after the transmitting sequential element, and the converting includes providing an X-to-random conversion module inserted into the asynchronous clock domain crossing prior to the receiving sequential element, wherein the X-to-random conversion module automatically performs the converting. The inserting of the simulation value of X into the combinatorial logic can be facilitated by inserting an X generating Wire Asynchronous Model into the asynchronous clock domain crossing between the transmitting sequential element and the combinatorial logic to facilitate automatic propagation of the simulation value X through the combinatorial logic during metastability periods of the combinatorial logic.

Apparatuses and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1A:
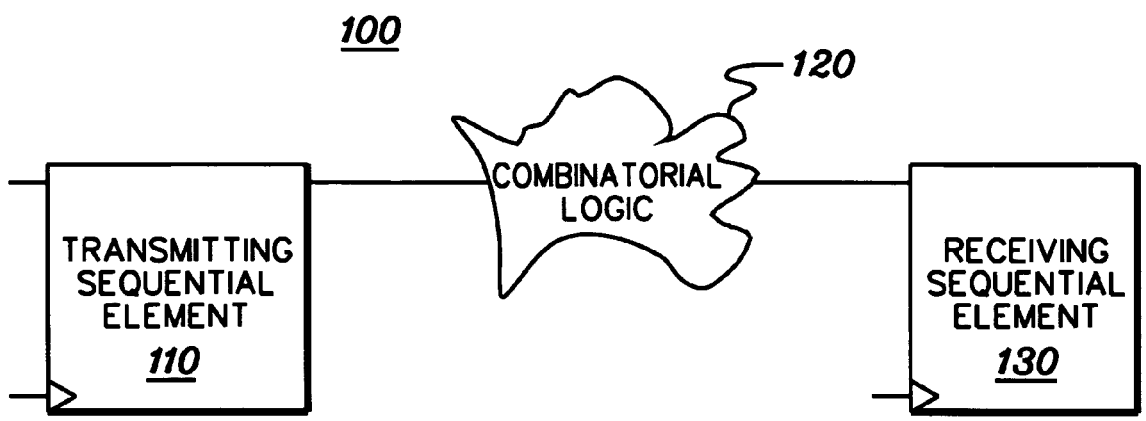
FIG. 1A is a block diagram representation of one embodiment of an asynchronous clock domain crossing of an integrated circuit design, which is to employ logic modeling, in accordance with an aspect of the present invention.
Figure 1B:
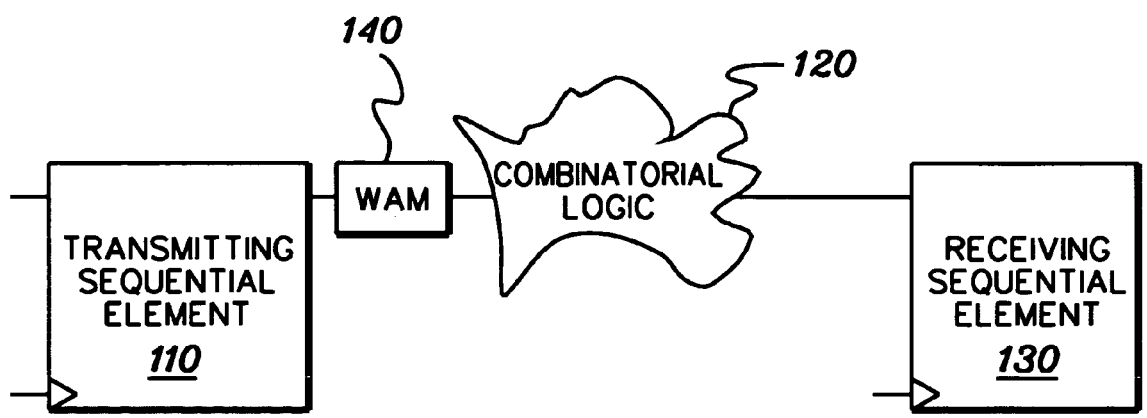
FIG. 1B is a block diagram of the exemplary asynchronous clock domain crossing of FIG. 1A illustrating the traditional manual or automatic insertion of a wire asynchronous model (WAM) into the crossing immediately after the transmitting sequential element for generating random logic values during metastability periods of the logic.
Figure 2:
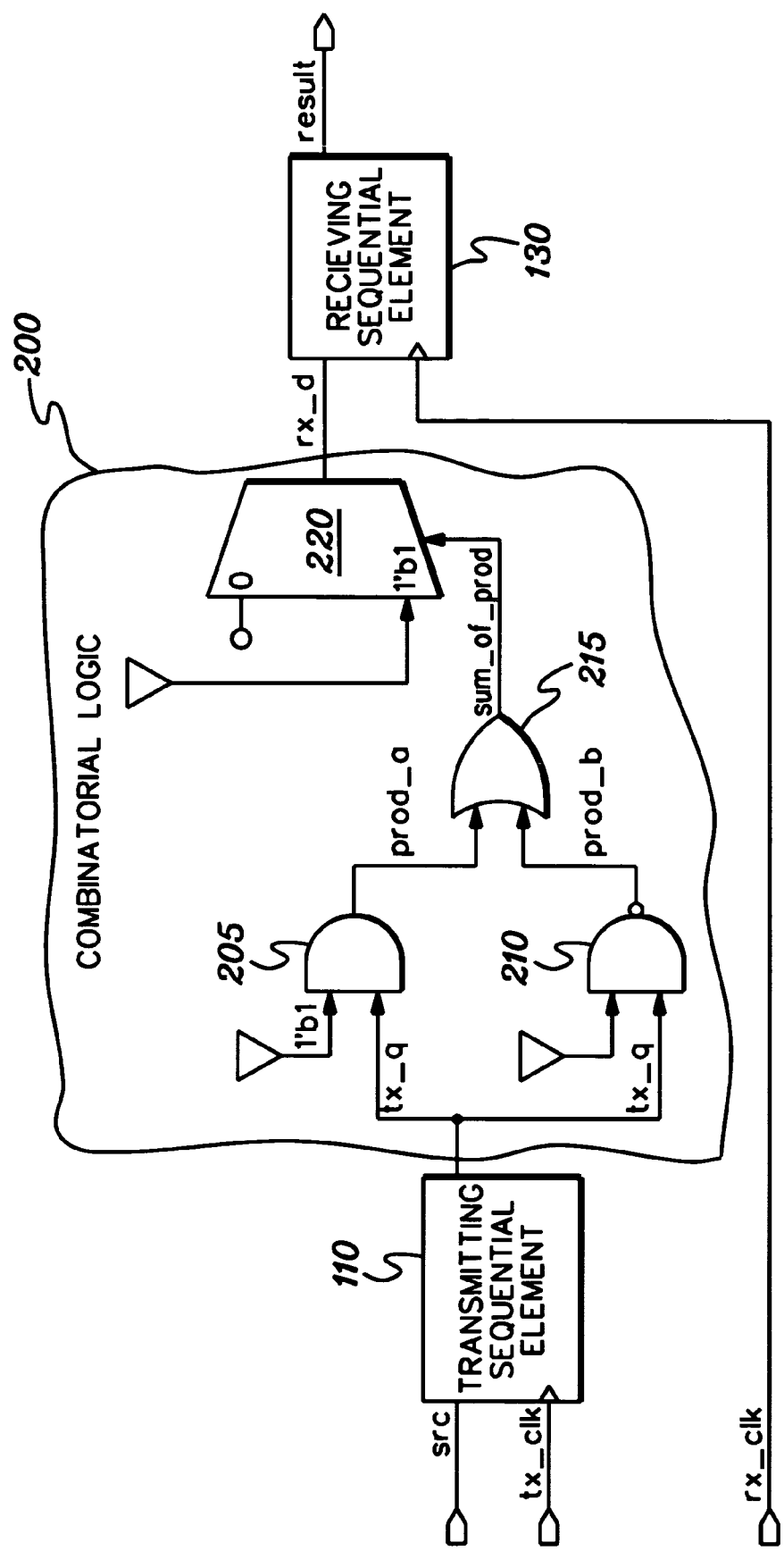
FIG. 2 is a logic diagram showing one embodiment of combinatorial logic cloud at an asynchronous clock domain crossing that is to be modeled, in accordance with an aspect of the present invention.

Presented herein is a technique for simulation modeling of circuitry. More particularly, disclosed herein is a technique for modeling combinatorial logic at an asynchronous clock domain crossing. A clock domain crossing glitch is often missed when a signal from a transmitting sequential element fans out and then converges in a combinatorial logic cloud between the clock domains. By way of example, FIG. 2 depicts a combinatorial logic cloud 200 wherein a signal tx_q fans out into AND logic 205 and NAND logic 210 and later converges in the sum_of_prod output from OR logic 215 between the tx_clk and rx_clk domains. In this example, the tx_clk signal clocks the transmitting sequential element 110, while the rx_clk signal clocks the receiving sequential element 130 at the clock domain crossing. The sum_of_prod signal controls a multiplexer 220, the output rx_d of which is the data value to the receiving sequential element 130. The logic value of 1, which is shown in FIG. 2 as 1′b1 (or the tie-up symbol), and the logic value 0 do not mean that these inputs are tied to the ASIC's VDD, VSS or GND rails, but rather that for the simulation scenarios being explored, these signals are held constant as indicated during the scenario.

Figure 3:
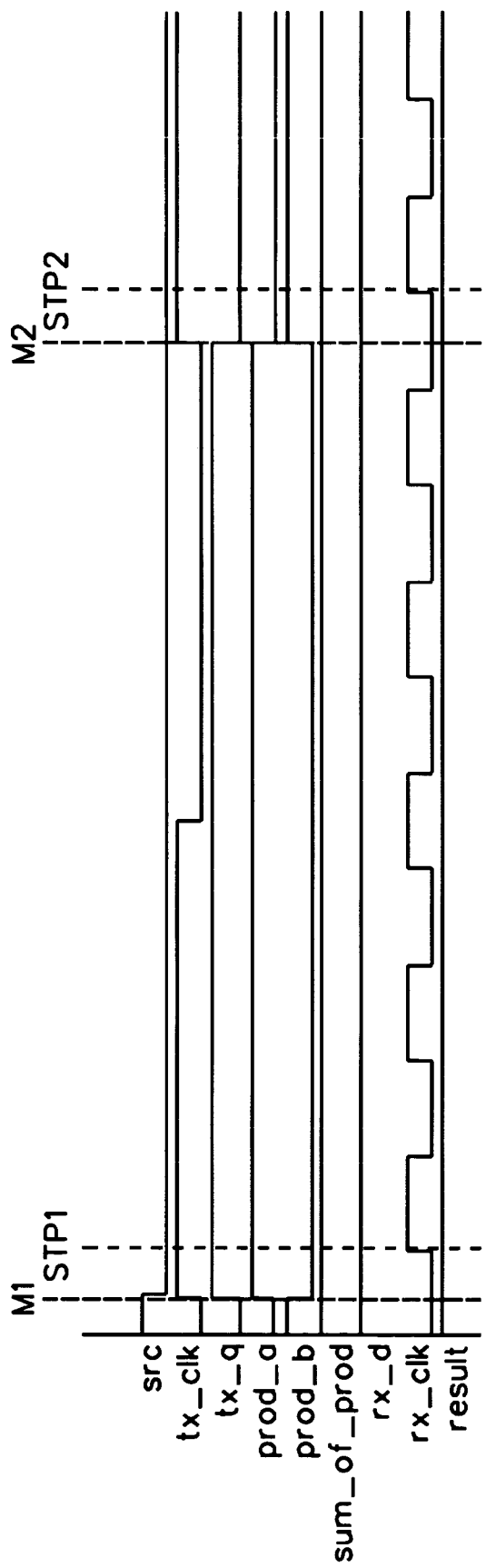
FIG. 3 is a timing diagram illustrating example logic values for the asynchronous clock domain crossing of FIG. 2 during one possible simulation thereof.

As can be seen from the signal waveforms of FIG. 3, which correspond to the labeled signals of FIG. 2, changes on signal tx_q do not cause any changes on rx_d even though changes on tx_q do cause internal switching within the combinatorial logic cloud 200 (FIG. 2) on prod_a and prod_b during simulation.

In the actual physical circuit, it is possible to have the receiving sequential element 130 (FIG. 2) signal out (i.e., result) sample another value due to prod_a and prod_b not switching simultaneously. Typically, during logic synthesis, the designer constrains the maximum path delay between domain crossings such that max_delay+worst_case_setup_time<ideal_maximum. The ideal_maximum is the worst case scenario to be accounted for by the logic of the function being simulated. By way of example, this ideal_maximum could be one period of the receiving clock frequency, which is typical for most clock domain crossings, but it can vary. To model this type of uncertainty, the simulation model needs to generate random data during intervals from M1 to STP1 and M2 to STP2 in the waveforms, i.e., during the metastability periods. The stop (STP) points are a delta cycle just after the first rising edge of the rx_clk signal.

Figure 4:
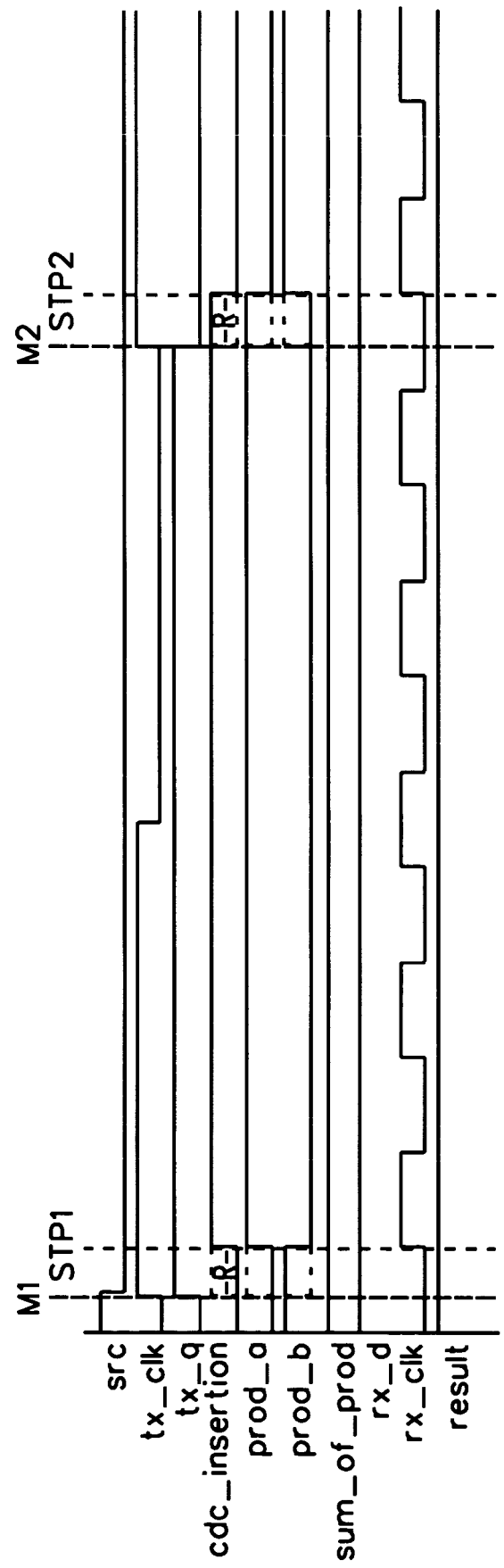
FIG. 4 is a timing diagram showing sample logic values for the asynchronous clock domain crossing of FIG. 2 with a traditional WAM inserted at the output of the transmitting sequential element of the asynchronous clock domain crossing.

As shown by the waveforms of FIG. 4, adding a traditional, random-signal (-R-) generating Wire Asynchronous Model (WAM) at the output of the transmitting sequential element (tx_q) does not reveal the clock domain crossing glitch problem. Even though during the M to STP intervals the random value is not the default value, it does not cause any noticeable change at either the output of the combinatorial logic cloud (rx_d) or the output of the receiving sequential element (result).

For the basic circuit example of FIG. 2, the clock domain crossing glitch in the combinatorial logic can be modeled by added two independent wire asynchronous models (WAMs) on each leg of the output of sequential element 110 (i.e., tx_q). However, for more complex (and realistic) combinatorial logic clouds, the effect of the signal may reconverge multiple times deep inside the logic cloud. These complications can make adding independent WAMs on parallel paths difficult and also error prone if done manually. The difficulty arises because it is important to not add more than one WAM in any particular functional path, and because several jitter sources may converge in the combinatorial logic cloud. For example, a simple combinatorial 4-bit grey counter increment function may require up to 34 independent WAMs to correctly model any potential glitch generation.

Figure 5:
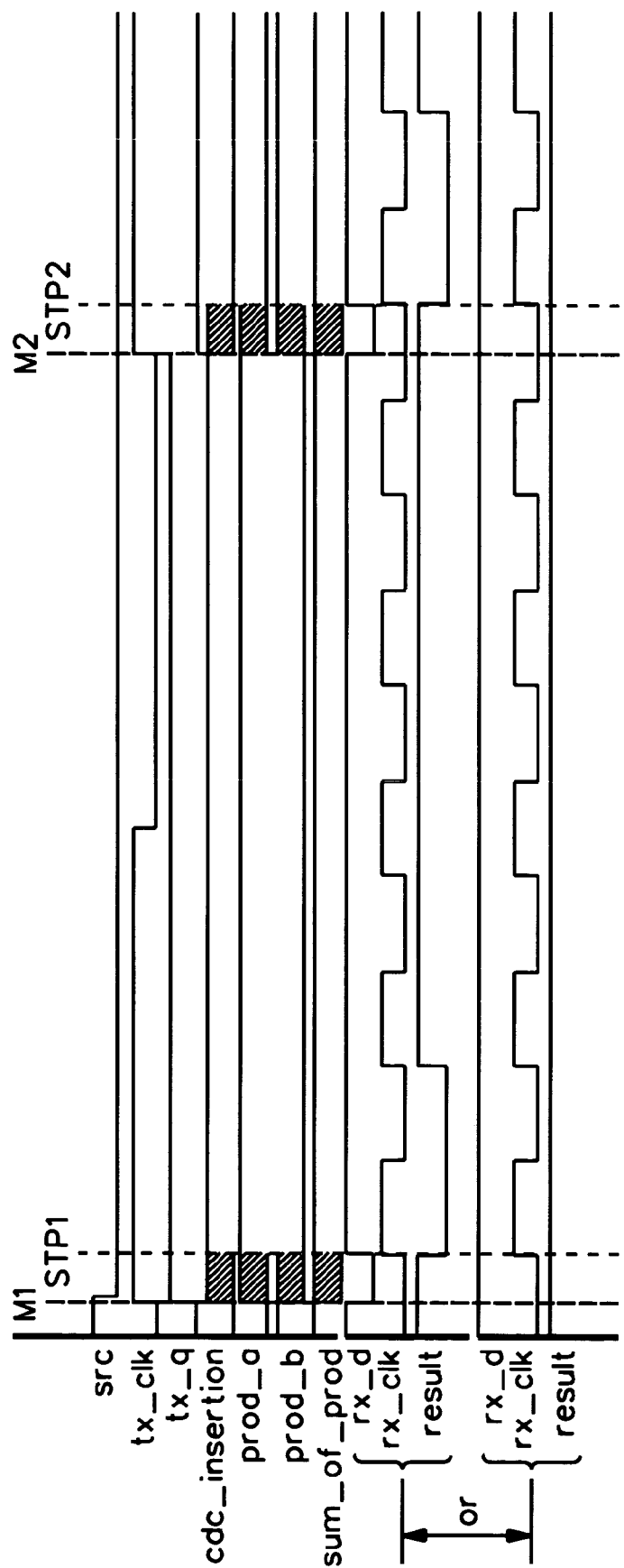
FIG. 5 is a timing diagram showing sample logic values for the asynchronous clock domain crossing of FIG. 2 wherein an X generating WAM generates a digital simulation value of X during a jitter (or metastability) window instead of a random 1 or 0, in accordance with an aspect of the present invention.

By way of example, a simulation tool employing wire asynchronous models is described in co-pending, commonly assigned U.S. patent application Ser. No. 10/904,056, filed Oct. 21, 2004, entitled "Simulation Testing of Digital Logic Circuit Designs," the entirety of which s hereby incorporated herein by reference. One of ordinary skill in the art can readily modify such existing WAMs to generate a digital simulation value of X during this jitter window or metastability period (instead of a random 1 or 0) as shown in FIG. 5. The simulation value of X has the advantage of being able to propagate through many types of combinatorial logic clouds, specifically those built from functional equations. For these parts of combinatorial clouds, the X will reveal where a glitch area can exist. However, use of the simulation value X has certain disadvantages, including: getting blocked/(inverted results) when encountering Register Transfer Language (RTL) process based combinatorial blocks. Register Transfer Language is a form of hardware description language either in Verilog or VHDL that defines the hardware with register transfer level constructs. Note how in FIG. 5 the rx_d signal either may consistently pulse a logic value 0 or hold at value 1 depending on the RTL. Slightly different RTL (if(sum_of_prod!= =1'b0) instead of if (sum_of_prod= =1'b1)), would result in either consistent blockage (no change) or constant inversion. Since no randomness exists in either model, neither accurately reflects clock domain crossing glitches in simulation. The simulation value of X can also cause severe simulation breakdown further along the simulation path. The present invention addresses these issues.

In one aspect, an efficient modeling technique for clock domain crossing glitch detection is presented. This technique leverages the fact that simulation value X will readily propagate through combinatorial clouds written as functional equations. The challenge is getting past the above-noted disadvantages caused by simply inserting a simulation value X generating Wire Asynchronous Model into the logic, that is, that the simulation value X gets blocked when encountering RTL process based combinatorial blocks, and can cause severe simulation breakdown further along the simulation model.

Generally stated, a technique for modeling combinatorial logic at asynchronous clock domain crossings is presented which employs a simulation value of X in combinatorial logic of the crossing of an ASIC for facilitating modeling of glitch prone logic. Employing the simulation value of X includes: generating at least one equivalent functional equation for at least one combinatorial path through the combinatorial logic; propagating the simulation value of X through the combinatorial logic using the at least one equivalent functional equation; and converting the simulation value of X at an output of the combinatorial logic to a random logic value for further propagation within the circuit being modeled.

More particularly, having a simulation value of X blocked by RTL is the nature of most process-based RTL constructs, such as Verilog's "if (signal= = =1'b1)" commands. To get around this problem, the logic simulator presented herein converts the RTL constructs to functional equations when used between clock domains.

When analyzing a combinatorial path, a clock domain crossing tool (in accordance with an aspect of the present invention) generates an equivalent functional equation to be used during simulation. This is only done for combinatorial logic located between clock domains, since doing it globally could produce inconsistent simulation results. Many logical synthesis approaches exists in the art, and the step of converting from RTL constructs to functional equations for one or more combinatorial paths through a combinatorial logic cloud at a clock domain crossing can readily be accomplished by one skilled in the art.

Figure 6:
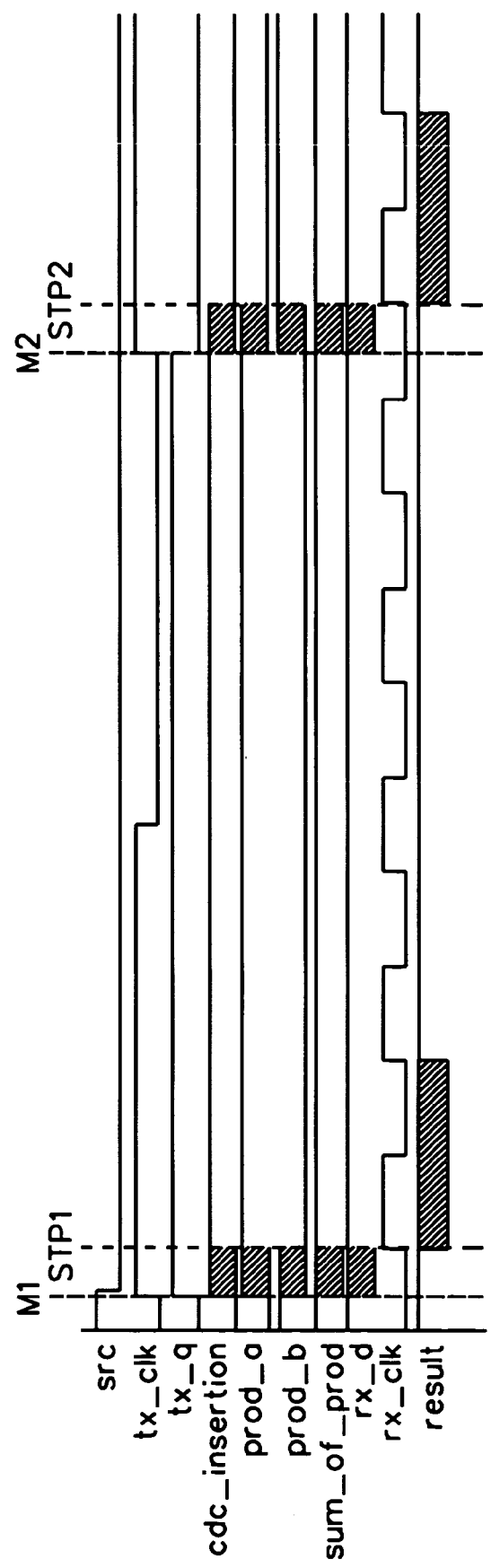
FIG. 6 is a timing diagram illustrating sample logic values for the asynchronous clock domain crossing of FIG. 2 showing propagation of a simulation value of X through the combinatorial logic cloud, in accordance with an aspect of the present invention.

The effect of doing so can be clearly seen in the waveform drawings of FIG. 6, wherein the simulation value X now appears in the result signal output from the receiving sequential element (see FIG. 2). Note, however, that the simulation value X seen on 'result' can potentially cause severe simulation breakdown further downstream within the circuit being modeled. To address this possibility, an X-to-random logic conversion module is inserted between the combinatorial logic cloud and the receiving sequential element as shown in FIG. 7.

Figure 7:
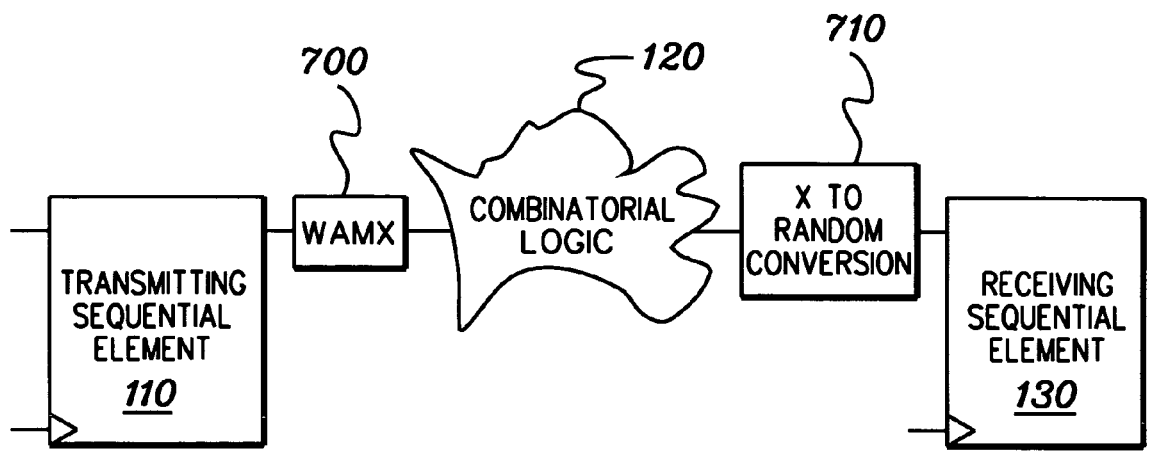
FIG. 7 depicts one embodiment of an asynchronous clock domain crossing with a combinatorial logic cloud, wherein an X generating Wire Asynchronous Model is inserted after the transmitting sequential element and an X-to-random conversion module is inserted between the combinatorial logic cloud and the receiving sequential element, in accordance with an aspect of the present invention.

In FIG. 7, an asynchronous clock domain crossing is again depicted at a transmitting sequential element 110 and receiving sequential element 130. Between these elements, a combinatorial logic cloud 120 exists. In accordance with the present invention, a Wire Asynchronous Model employing the simulation value X (WAMX) 700 is inserted after the transmitting sequential element 110 for facilitating propagation of a simulation value X through one or more combinatorial paths of the combinatorial logic cloud, while before the receiving sequential element 130, an X-to-random conversion module 710 is inserted to convert any simulation value X output from the cloud to a random logic value (i.e., either value 0 or 1). As noted above, this conversion module 710 can be readily implemented by one skilled in the art. The module simply notes the existence of a simulation value X, and when noted, transitions the signal to a random value, i.e., randomly inserts a logic value 0 or 1.

Figure 8:
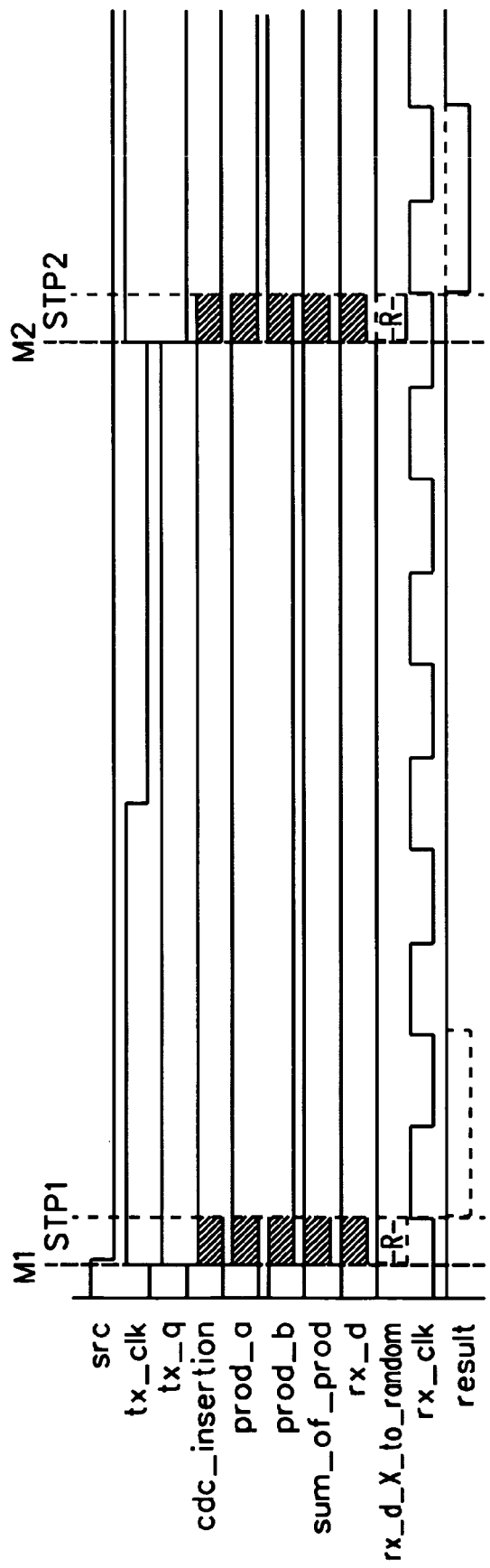
FIG. 8 is a timing diagram illustrating sample logic values for the asynchronous clock domain crossing embodiment of FIG. 7, and assuming the combinatorial logic cloud configuration of FIG. 2, in accordance with an aspect of the present invention.

By converting the rx_d signal of FIG. 6 to a random value during periods of simulation value X, clock domain crossing glitches are effectively modeled as random values at the receiving sequential element as shown in FIG. 8. In this figure, note how the value rx_d received during the M1 to STP1 interval is now independent of the value received during the M2 to STP2 interval. Further, note that the simulation value X is no longer propagated within the result signal, but rather a random value is inserted. Immediately following time STP1, the random value is arbitrarily logic value 1, while immediately following STP2, the random value is arbitrarily logic value 0 in the depicted waveforms.

The capabilities of one or more aspects of the present invention can be implemented in software, firmware, hardware or some combination thereof, e.g., within a circuit modeling/simulation tool or separately therefrom.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for modeling combinatorial logic at an asynchronous clock domain crossing, the method comprising:

employing a digital simulation logic value X in combinatorial logic at an asynchronous clock domain crossing of a circuit being modeled for facilitating modeling of a combinatorial logic glitch, wherein the digital simulation logic value X is different from a simulation logic value 0 or a simulation logic value 1, the employing comprising:

propagating the simulation logic value X through the combinatorial logic at the asynchronous clock domain crossing; and converting the simulation logic value X at an output of the combinatorial logic to a random logic value 0 or 1 for further propagation within the circuit being modeled.

2. The method of claim 1, wherein the employing further comprises prior to the propagating, analyzing at least one combinatorial logic path of the combinatorial logic at the asynchronous clock domain crossing and generating at least one equivalent functional equation for the at least one combinatorial logic path, and wherein the propagating comprises propagating the simulation logic value X through the combinatorial logic using the at least one equivalent functional equation.

3. The method of claim 2, wherein the generating comprises generating the at least one equivalent functional equation for each Register Transfer Language based combinatorial block in the at least one combinatorial logic path.

4. The method of claim 3, wherein the generating at least one equivalent functional equation for the at least one combinatorial logic path is performed only for combinatorial logic at an asynchronous clock domain crossing of the circuit being modeled.

5. The method of claim 1, wherein the asynchronous clock domain crossing comprises a transmitting sequential element and a receiving sequential element, with the combinatorial logic being disposed between the transmitting sequential element and the receiving sequential element, and wherein the method further comprises inserting the simulation logic value X into the combinatorial logic after the transmitting sequential element, and wherein the converting comprises inserting an X-to-random conversion module into the asynchronous clock domain crossing prior to the receiving sequential element, wherein the X-to-random conversion module automatically performs said converting.

6. The method of claim 5, wherein the inserting comprises providing an X generating Wire Asynchronous Model inserted into the asynchronous clock domain crossing between the transmitting sequential element and the combinatorial logic to facilitate automatic generation and propagation of the simulation logic value X through the combinatorial logic during metastability periods of the combinatorial logic.

7. The method of claim 5, wherein the combinatorial logic glitch being modeled potentially arises due to at least one race condition between at least one set of parallel logic paths within the combinatorial logic at the asynchronous clock domain crossing.

8. Apparatus for modeling combinatorial logic at an asynchronous clock domain crossing, the apparatus comprising:

means for employing a digital simulation logic value X in combinatorial logic at an asynchronous clock domain crossing of a circuit being modeled for facilitating modeling of a combinatorial logic glitch, wherein the digital simulation logic value X is different from a simulation logic value 0 or a simulation logic value 1, the means for employing comprising:

means for propagating the simulation logic value X through the combinatorial logic at the asynchronous clock domain crossing; and means for converting the simulation logic value X at an output of the combinatorial logic to a random logic value 0 or 1 for further propagation within the circuit being modeled.

9. The apparatus of claim 8, wherein the means for employing further comprises prior to the means for propagating, means for analyzing at least one combinatorial logic path of the combinatorial logic at the asynchronous clock domain crossing and means for generating at least one equivalent functional equation for the at least one combinatorial logic path, and wherein the means for propagating comprises means for propagating the simulation logic value X through the combinatorial logic using the at least one equivalent functional equation.

10. The apparatus of claim 9, wherein the means for generating comprises means for generating the at least one equivalent functional equation for each Register Transfer Language based combinatorial block in the at least one combinatorial logic path.

11. The apparatus of claim 10, wherein the means for generating at least one equivalent functional equation for the at least one combinatorial logic path is performed only for combinatorial logic at an asynchronous clock domain crossing of the circuit being modeled.

12. The apparatus of claim 8, wherein the asynchronous clock domain crossing comprises a transmitting sequential element and a receiving sequential element, with the combinatorial logic being disposed between the transmitting sequential element and the receiving sequential element, and wherein the apparatus further comprises means for inserting the simulation logic value X into the combinatorial logic after the transmitting sequential element, and wherein the means for converting comprises an X-to-random conversion module inserted into the asynchronous clock domain crossing prior to the receiving sequential element, wherein the X-to-random conversion module automatically performs said means for converting.

13. The apparatus of claim 12, wherein the means for inserting comprises providing an X generating Wire Asynchronous Model inserted into the asynchronous clock domain crossing between the transmitting sequential element and the combinatorial logic to facilitate automatic generation and propagation of the simulation logic value X through the combinatorial logic during metastability periods of the combinatorial logic.

14. The apparatus of claim 12, wherein the combinatorial logic glitch being modeled potentially arises due to at least one race condition between at least one set of parallel logic paths within the combinatorial logic at the asynchronous clock domain crossing.

15. At least one program storage device readable by a processor, tangibly embodying at least one program of instructions executable by the processor to perform a method for modeling combinatorial logic at an asynchronous clock domain crossing, the method comprising:

employing a digital simulation logic value X in combinatorial logic at an asynchronous clock domain crossing of a circuit being modeled for facilitating modeling of a combinatorial logic glitch, wherein the digital simulation logic value X is different from a simulation logic value 0 or a simulation logic value 1, the employing comprising:

propagating the simulation logic value X through the combinatorial logic at the asynchronous clock domain crossing; and converting the simulation logic value X at an output of the combinatorial logic to a random logic value 0 or 1 for further propagation within the circuit being modeled.

16. The at least one program storage device of claim 15, wherein the employing further comprises prior to the propagating, analyzing at least one combinatorial logic path of the combinatorial logic at the asynchronous clock domain crossing and generating at least one equivalent functional equation for the at least one combinatorial logic path, and wherein the propagating comprises propagating the simulation logic value X through the combinatorial logic using the at least one equivalent functional equation.

17. The at least one program storage device of claim 16, wherein the generating comprises generating the at least one equivalent functional equation for each Register Transfer Language based combinatorial block in the at least one combinatorial logic path.

18. The at least one program storage device of claim 17, wherein the generating at least one equivalent functional equation for the at least one combinatorial logic path is performed only for combinatorial logic at an asynchronous clock domain crossing of the circuit being modeled.

19. The at least one program storage device of claim 15, wherein the asynchronous clock domain crossing comprises a transmitting sequential element and a receiving sequential element, with the combinatorial logic being disposed between the transmitting sequential element and the receiving sequential element, and wherein the method further comprises inserting the simulation logic value X into the combinatorial logic after the transmitting sequential element, and wherein the converting comprises inserting an X-to-random conversion module into the asynchronous clock domain crossing prior to the receiving sequential element, wherein the X-to-random conversion module automatically performs said converting.

20. The at least one program storage device of claim 19, wherein the inserting comprises providing an X generating Wire Asynchronous Model inserted into the asynchronous clock domain crossing between the transmitting sequential element and the combinatorial logic to facilitate automatic generation and propagation of the simulation logic value X through the combinatorial logic during metastability periods of the combinatorial logic.

* * * * *